US012772828B2

(12) United States Patent
Vega et al.

(10) Patent No.: US 12,772,828 B2
(45) Date of Patent: Oct. 20, 2026

(54) SELF-ALIGNED ZERO TRACK SKIP

(71) Applicant: INTERNATIONAL BUSINESS MACHINES CORPORATION, Armonk, NY (US)

(72) Inventors: Reinaldo Vega, Mahopac, NY (US); Nicholas Anthony Lanzillo, Wynantskill, NY (US); Takashi Ando, Eastchester, NY (US); David Wolpert, Poughkeepsie, NY (US); Albert M. Chu, Nashua, NH (US); Albert M. Young, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 741 days.

(21) Appl. No.: 17/969,773

(22) Filed: Oct. 20, 2022

(65) Prior Publication Data

US 2024/0136281 A1 Apr. 25, 2024
US 2024/0234306 A9 Jul. 11, 2024

(51) Int. Cl.
*H10W 20/43* (2026.01)
*H10P 50/00* (2026.01)
*H10W 20/00* (2026.01)
*H10W 20/42* (2026.01)

(52) U.S. Cl.
CPC ............. *H10W 20/43* (2026.01); *H10P 50/71* (2026.01); *H10W 20/067* (2026.01); *H10W 20/42* (2026.01)

(58) Field of Classification Search
CPC ............. H01L 23/528; H01L 21/32139; H01L 21/76892; H01L 23/5226; H01L 23/485; H01L 21/76852; H01L 21/76885; H10W 10/43; H10W 20/067; H10W 20/42; H10W 20/43; H10W 20/40; H10W 20/063; H10W 20/039; H10P 50/71
See application file for complete search history.

(56) References Cited

U.S. PATENT DOCUMENTS

| | | | |
|---|---|---|---|
| 8,080,475 | B2 | 12/2011 | Rao et al. |
| 9,793,164 | B2 | 10/2017 | Machkaoutsan et al. |
| 9,911,651 | B1 | 3/2018 | Briggs et al. |
| 10,020,223 | B1 | 7/2018 | Anderson et al. |
| 10,236,350 | B2 | 3/2019 | Bouche et al. |
| 10,290,544 | B2 | 5/2019 | Xie et al. |
| 10,347,579 | B2 | 7/2019 | Xu et al. |
| 10,522,403 | B2 | 12/2019 | Stephens et al. |
| 10,546,774 | B2 | 1/2020 | Burns et al. |

(Continued)

FOREIGN PATENT DOCUMENTS

KR 102044526 A * 5/2011 ............. G10L 21/02

*Primary Examiner* — Galina G Yushina
(74) *Attorney, Agent, or Firm* — Harrity & Harrity, LLP

(57) ABSTRACT

A semiconductor structure is presented including a first level of interconnect wiring separated into a first interconnect wiring segment and a second interconnect wiring segment, the first interconnect wiring segment defining a first line segment and the second interconnect wiring segment defining a second line segment and a second level interconnect wiring positioned orthogonally to the first level of interconnect wiring. A distalmost end of the first line segment and a distalmost end of the second line segment are separated by a spacing less than or equal to a spacing of the second level interconnect wiring defining a zero track skip.

20 Claims, 6 Drawing Sheets

(56) References Cited

U.S. PATENT DOCUMENTS

| | | | | |
|---|---|---|---|---|
| 11,139,205 | B2 | 10/2021 | Zhong et al. | |
| 2001/0017418 | A1* | 8/2001 | Noguchi | H01L 23/5222 257/758 |
| 2015/0037980 | A1* | 2/2015 | Rha | H01L 21/76832 438/700 |
| 2015/0140833 | A1* | 5/2015 | Thadani | H01L 21/67742 438/762 |
| 2017/0158517 | A1* | 6/2017 | Tanaka | B01J 19/087 |
| 2017/0213726 | A1* | 7/2017 | Saly | C23C 16/45542 |
| 2019/0139823 | A1 | 5/2019 | Chen et al. | |
| 2020/0098688 | A1* | 3/2020 | Shi | H10W 20/069 |
| 2020/0357692 | A1* | 11/2020 | Mignot | H10W 20/056 |
| 2022/0108948 | A1 | 4/2022 | Weckx et al. | |
| 2022/0301932 | A1* | 9/2022 | Lai | H10W 20/063 |
| 2022/0384340 | A1* | 12/2022 | Shin | H01L 21/76897 |
| 2022/0406817 | A1* | 12/2022 | Park | H10H 20/84 |
| 2023/0068364 | A1* | 3/2023 | Choi | H10D 84/85 |
| 2024/0136281 | A1* | 4/2024 | Vega | H01L 23/5226 |

* cited by examiner

SELF-ALIGNED ZERO TRACK SKIP

BACKGROUND

The present invention relates generally to semiconductor devices, and more specifically, to constructing a self-aligned zero track skip.

Semiconductor devices are used in a variety of electronic applications, such as personal computers, cell phones, digital cameras, and other electronic equipment. Semiconductor devices are usually fabricated by sequentially depositing insulating or dielectric layers, conductive layers, and semiconductive layers of material over a semiconductor substrate, and patterning the various material layers using lithography to form circuit components and elements thereon.

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node. With the increased demands for miniaturization, higher speed, greater bandwidth, lower power consumption, and lower latency, chip layout has become more complicated and difficult to achieve in the production of semiconductor dies.

SUMMARY

In accordance with an embodiment, a semiconductor structure is provided. The semiconductor structure includes a first level of interconnect wiring separated into a first interconnect wiring segment and a second interconnect wiring segment, the first interconnect wiring segment defining a first line segment and the second interconnect wiring segment defining a second line segment and a second level interconnect wiring positioned orthogonally to the first level of interconnect wiring. A distalmost end of the first line segment and a distalmost end of the second line segment are separated by a spacing less than or equal to a spacing of the second level interconnect wiring, the spacing defining a zero track skip.

In accordance with another embodiment, a semiconductor structure is provided. The semiconductor structure includes a first level of interconnect wiring exhibiting a self-aligned cut and a second level interconnect wiring positioned orthogonally to the first level of interconnect wiring. The first level of interconnect wiring is split into two segments to define a pair of line segments with tip-to-tip spacing less than or equal to a spacing of the second level interconnect wiring.

In accordance with yet another embodiment, a method for forming a semiconductor structure is provided. The method includes forming a first level of interconnect wiring, forming a second level interconnect wiring orthogonally to the first level of interconnect wiring by subtractive etching, disposing a capping layer over and in direct contact with the second level interconnect wiring, disposing an etch-resistant liner on sidewalls of the second level interconnect wiring and sidewalls of the capping layer, depositing a litho mask, and creating an opening through the litho mask and between the second level interconnect wiring to separate the first level of interconnect wiring into a first interconnect wiring segment and a second interconnect wiring segment, the first interconnect wiring segment defining a first line segment and the second interconnect wiring segment defining a second line segment. A distalmost end of the first line segment and a distalmost end of the second line segment are separated by a spacing less than or equal to a spacing of the second level interconnect wiring, the spacing defining a zero track skip.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for constructing a self-aligned zero track skip. In conventional semiconductor physical layouts, a single track skip is common for maintaining a high pin access density. However, a single track skip limits cell height compression. The exemplary self-aligned zero track skip can reduce cell height by 1 track or approximately 20%. The exemplary self-aligned zero track skip permits signal track enablement with backside power distribution networks (BSPDNs).

The exemplary semiconductor structure includes at least one pair of line segments of a metal layer (e.g., M1 layer) with a tip-to-tip spacing included within a single pitch of the overlying metal layer (e.g., M2 layer). The exemplary semiconductor structure further includes a first and second metal layer where the first metal layer exhibits a self-aligned cut, being within a single metal pitch of the second metal layer, by using the second metal layer as a hardmask.

Examples of semiconductor materials that can be used in forming such structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
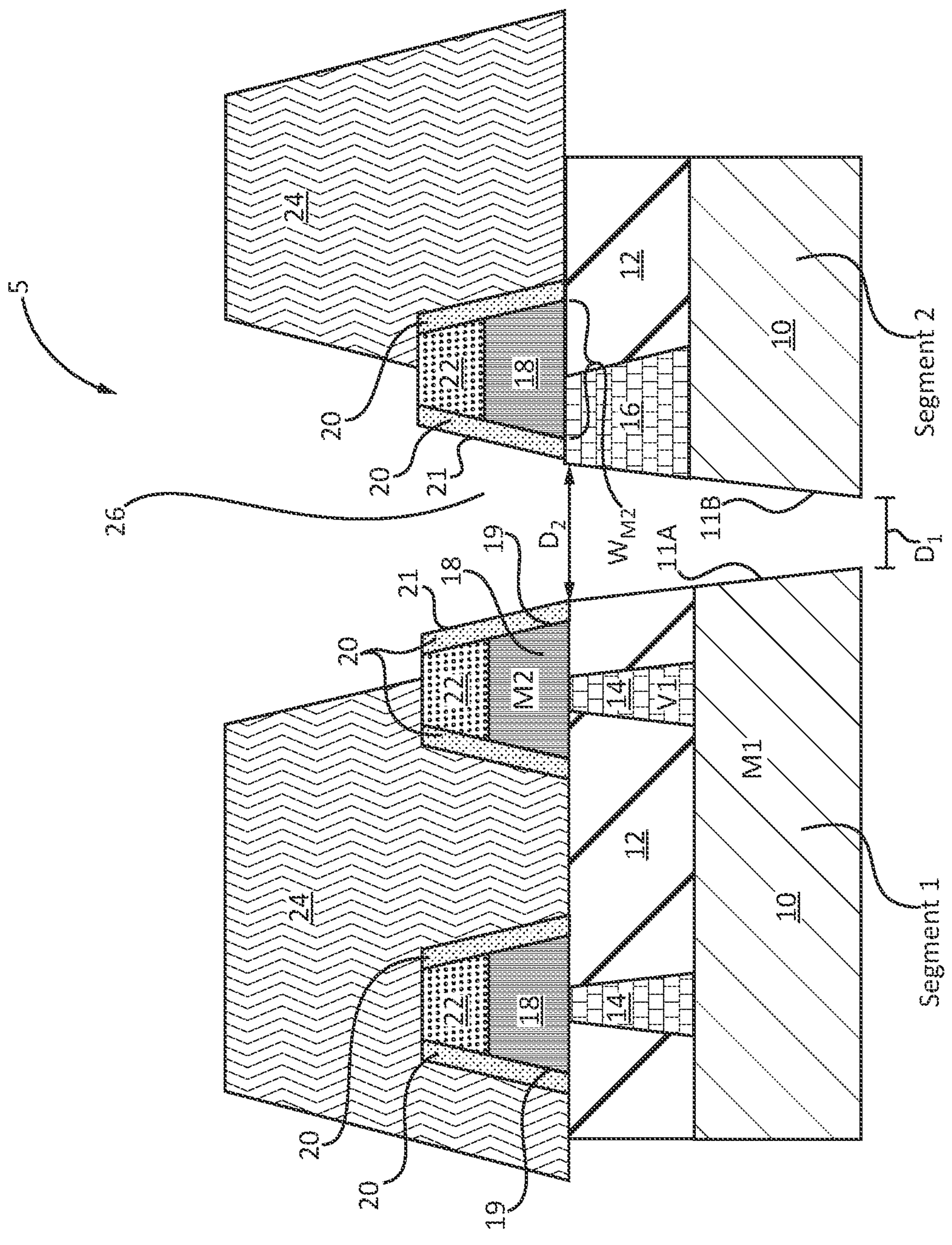
FIG. 1 is a cross-sectional view of a semiconductor structure depicting a self-aligned zero track skip, in accordance with an embodiment of the present invention.

FIG. 1 is a cross-sectional view of a semiconductor structure depicting a self-aligned zero track skip, in accordance with an embodiment of the present invention.

In various example embodiments, a structure 5 includes the formation of an M1 layer 10. A dielectric layer 12 is deposited over the M1 layer 10. Vias are formed through the dielectric layer 12 to the top surface of the M1 layer 10. For example, vias 14 are formed to a first segment of the M1 layer 10 and via 16 is formed to a second segment of the M1 layer 10. An M2 layer 18 is then formed subtractively with a capping layer 22 formed thereon. The M1 layer 10 is positioned orthogonally to the M2 layer 18. A hardmask 20 is then deposited on sidewalls of the M2 layer 18 and the capping layer 22. The hardmask 20 can also be referred to as an etch-resistant liner 20 covering the sidewalls of the M2 layer 18. The M2 layer 18 directly contacts the vias 14, 16. A litho mask 24 is then deposited and an opening 26 is created between adjacent M2 layers 18. The opening 26 can be created by, e.g., reactive ion etch (RIE).

The opening 26 splits the M1 layer 10 into a first segment and a second segment. Thus, the above metal level (e.g., M2) is used as an etch mask to achieve a self-aligned zero track skip. In other words, a subtractive M(x+1) layer is used itself as an etch mask to form the self-aligned zero track skip at a tip-to-tip spacing ($D_1$) on the metal layer below, e.g., M1 layer. Spacing $D_2$ defines the minimum open spacing between the M2 regions. An advantage of the exemplary structure is that the spacing between the M(x+1) lines defines the Mx line end spacing (or tip-to-tip spacing) by a self-aligned RIE. Another advantage of the exemplary structure is that the structure does not present an aspect ratio limitation for the Mx layer.

The first segment of the M1 layer 10 defines a first line segment 11A and the second segment of the M1 layer 10 defines a second line segment 11B. The distalmost end of the first line segment 11A and the distalmost end of the second line segment 11B are separated by a spacing $D_1$ less than or equal to the metal line width ($W_{M2}$) of the second metal layer (the M2 layer 18). The M2 layer 18 has a tapered surface 19. Additionally, the capping layer 22 has a tapered surface. This results in the hardmask 20 being slanted or oblique or non-perpendicular to the M1 layer 10. Moreover, the adjacent distalmost ends of the first and second line segments 11A, 11B are self-aligned to the corresponding inside edges 21 of the second metal layer (the M2 layer 18) directly overhead. The formation of the first and second line segments 11A, 11B is performed with, e.g., RIE, using at least the second metal layer (the M2 layer 18) as an etch mask.

Regarding the self-alignment of inside edges 21 to the first and second line segments 11A, 11B, there is an etch profile, which means that those edges are not exactly aligned due to the angle of the etch profile. However, this is a result of a self-aligned etch. As a result, sometimes the self-aligned etch is not perfectly vertical. In other words, the inside edges 21 form the basis for the subsequent "self-aligned" etch of the M1 layer 10. As this etch proceeds through the dielectric layer 12 (as well as the vias 14 and 16, if they are in the etch path), etch loading effects restrict the inflow of the etch product and the outflow of the etch by-product. This reduces the space where etching occurs, thus resulting in a tapered etch profile as the etch front shrinks. As a result, although the first and second line segments 11A and 11B are formed using inside edges 21 as a basis for a "self-aligned" etch, if the etch profile is not perfectly vertical, then the first and second line segments 11A and 11B will not be positioned exactly beneath inside edges 21. However, the first and second line segments 11A and 11B maintain a uniform offset to their respective edge 21 and so this is still defined as a self-aligned feature.

Therefore, a first level of interconnect wiring 10 is separated into a first interconnect wiring segment and a second interconnect wiring segment, the first interconnect wiring segment defining a first line segment 11A and the second interconnect wiring segment defining a second line segment 11B. A second level interconnect wiring 18 positioned orthogonally to the first level of interconnect wiring 10. A distalmost end of the first line segment 11A and a distalmost end of the second line segment 11B are separated by a spacing ($D_1$) less than or equal to a width ($W_{M2}$) of the second level interconnect wiring 18, the spacing defining a zero track skip.

The second level interconnect wiring 18 is subtractively patterned to define a positive tapered angle 19. Outer surfaces of the first and second line segments 11A, 11B are self-aligned to corresponding outer surfaces (or inside edges) 21 of the second level interconnect wiring 18. A capping layer 22 is disposed over and in direct contact with the second level interconnect wiring 18. The capping layer 22 defines a positive tapered angle. An etch-resistant liner 20 is disposed on sidewalls of the second level interconnect wiring 18 and sidewalls of the capping layer 22. The etch-resistant liner 20 defines a positive tapered angle. The separation of the first level of interconnect wiring 10 into the first interconnect wiring segment and the second interconnect wiring segment occurs directly between the second level interconnect wiring 18. Moreover, the first level of interconnect wiring 10 exhibits a self-aligned cut having a width (dimensioned or contained or confined) within the width ($W_{M2}$) of the second level interconnect wiring 18. A via 16 connecting the first level of interconnect wiring 10 to the second level of interconnect wiring 18 is larger than the width of the second level interconnect wiring 18.

Stated differently, the exemplary structure includes a first level of interconnect wiring 10 exhibiting a self-aligned cut and a second level interconnect wiring 18 positioned orthogonally to the first level of interconnect wiring 10 such that the first level of interconnect wiring 10 is split into two segments to define a pair of line segments 11A, 11B with tip-to-tip spacing ($D_1$) less than or equal to a width ($W_{M2}$) of the second level interconnect wiring 18. The tip-to-tip spacing defines a zero track skip. The self-aligned cut has a width dimensioned or contained or confined within the width of the second level interconnect wiring 18. Moreover, outer surfaces of the pair of line segments 11A, 11B are self-aligned to corresponding outer surfaces of the second level interconnect wiring 18.

Non-limiting examples of suitable conductive materials for the M1 and M2 layers 10, 18 include a silicide liner such as Ti, Ni, NiPt, etc., an adhesion metal liner, such as TiN, TaN, and conductive metal fill, such as Al, W, Co, Ru, etc. The conductive material can further include dopants that are incorporated during or after deposition. The conductive metal can be deposited by a suitable deposition process, for example, CVD, PECVD, PVD, plating, thermal or e-beam evaporation, and sputtering.

The hardmask 20 can be. e.g., a tantalum nitride (TaN) hardmask.

The etching can include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist.

The dry and wet etching processes can have etching parameters that can be tuned, such as etchants used, etching temperature, etching solution concentration, etching pressure, source power, RF bias voltage, RF bias power, etchant flow rate, and other suitable parameters. Dry etching processes can include a biased plasma etching process that uses a chlorine-based chemistry. Other dry etchant gasses can include Tetrafluoromethane ($CF_4$), nitrogen trifluoride ($NF_3$), sulfur hexafluoride ($SF_6$), and helium (He), and Chlorine trifluoride ($ClF_3$). Dry etching can also be performed anisotropically using such mechanisms as DRIE (deep reactive-ion etching). Chemical vapor etching can be used as a selective etching method, and the etching gas can include hydrogen chloride (HCl), Tetrafluoromethane ($CF_4$), and gas mixture with hydrogen ($H_2$). Chemical vapor etching can be performed by CVD with suitable pressure and temperature.

Regarding various dielectrics or dielectric layers discussed herein, the dielectrics can include, but are not limited to, SiN, SiOCN, SiOC, SiC, SiON, SiBCN, $SO_2$, or ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 10.

In some embodiments, the dielectrics can be conformally deposited using atomic layer deposition (ALD) or, chemical vapor deposition (CVD). Variations of CVD processes suitable for forming the dielectrics include, but are not limited to, Atmospheric Pressure CVD (APCVD), Low Pressure CVD (LPCVD) and Plasma Enhanced CVD (PECVD), Metal-Organic CVD (MOCVD) and combinations thereof can also be employed.

Figure 2:
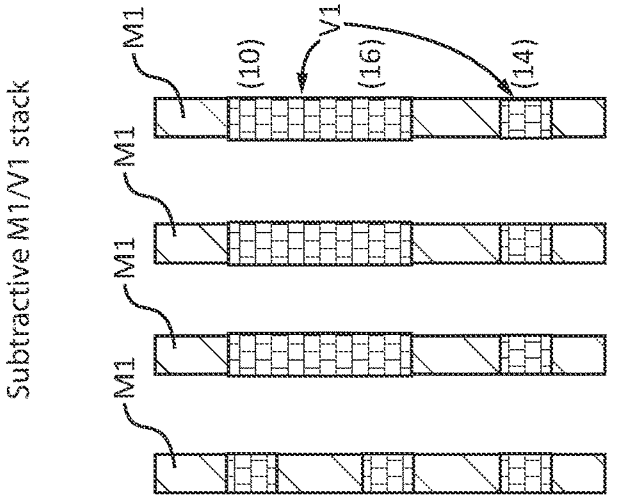
FIG. 2 is a top view of the semiconductor structure of FIG. 1 depicting the self-aligned zero track skip where the M1/V1 stack is formed, in accordance with an embodiment of the present invention.

FIG. 2 is a top view of the semiconductor structure of FIG. 1 depicting the self-aligned zero track skip where the M1/V1 stack is formed, in accordance with an embodiment of the present invention.

In various example embodiments, the top view illustrates the formation of the M1 layer 10 and the vias 14, 16. The vias can be designated as V1. The M1/V1 stack can be formed by subtractive etch. V1 is intentionally patterned to be larger than a width ($W_{M2}$) of the second metal layer (the M2 layer 18).

Figure 3:
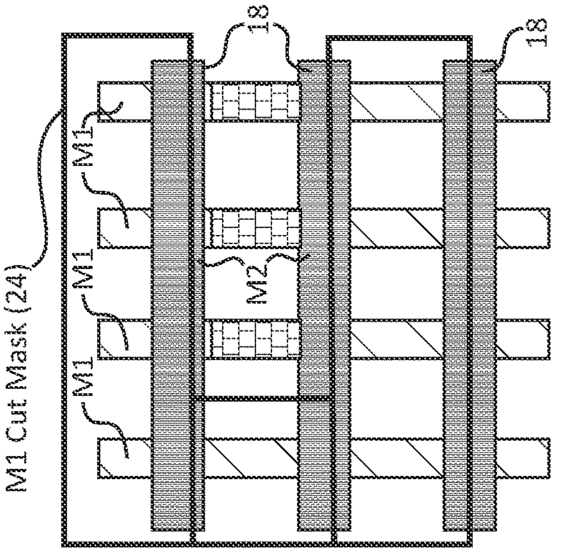
FIG. 3 is a top view of the semiconductor structure of FIG. 2 where the M2 layer is formed by subtractive etch, in accordance with an embodiment of the present invention.

FIG. 3 is a top view of the semiconductor structure of FIG. 2 where the M2 layer is formed by subtractive etch, in accordance with an embodiment of the present invention.

In various example embodiments, an M1 cut mask 24 is applied to form the M2 layer 18. The M2 layer 18 is orthogonal to the M1 layer 10. The M2 layer 18 is formed by subtractive etch. In an alternative embodiment, a via, V2 (not shown), can also be formed with a cap and a liner, such as, e.g., a titanium nitride (TiN) liner.

Figure 4:
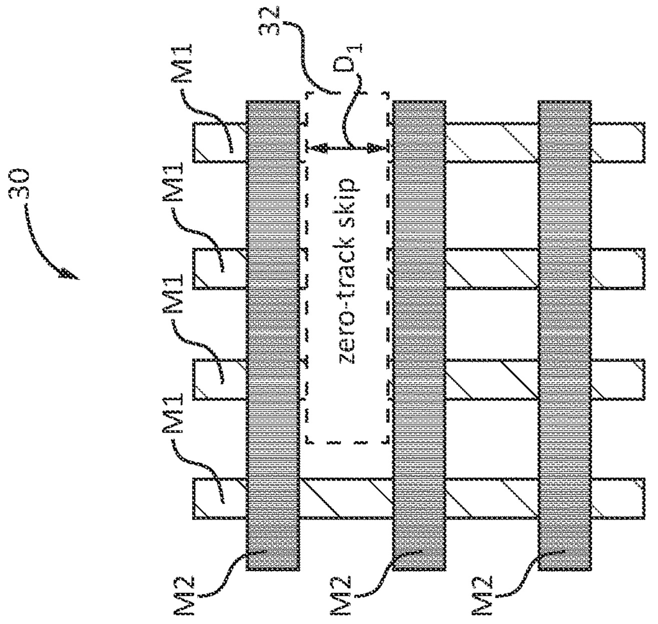
FIG. 4 is top view of the semiconductor structure of FIG. 3 where a reactive ion etch (RIE) through the M1 layer takes place to form the zero track skip, in accordance with an embodiment of the present invention.

FIG. 4 is top view of the semiconductor structure of FIG. 3 where a reactive ion etch (RIE) through the M1 layer takes place to form the zero track skip, in accordance with an embodiment of the present invention.

In various example embodiments, in structure 30, a RIE is performed through the M1 layer 10 such that a zero track skip 32 is formed. The zero track skip 32 is formed after partial removal of the litho mask 24. The distance or spacing $D_1$ indicates separation between the distalmost end of the first line segment 11A and the distalmost end of the second line segment 11B.

Figure 5:
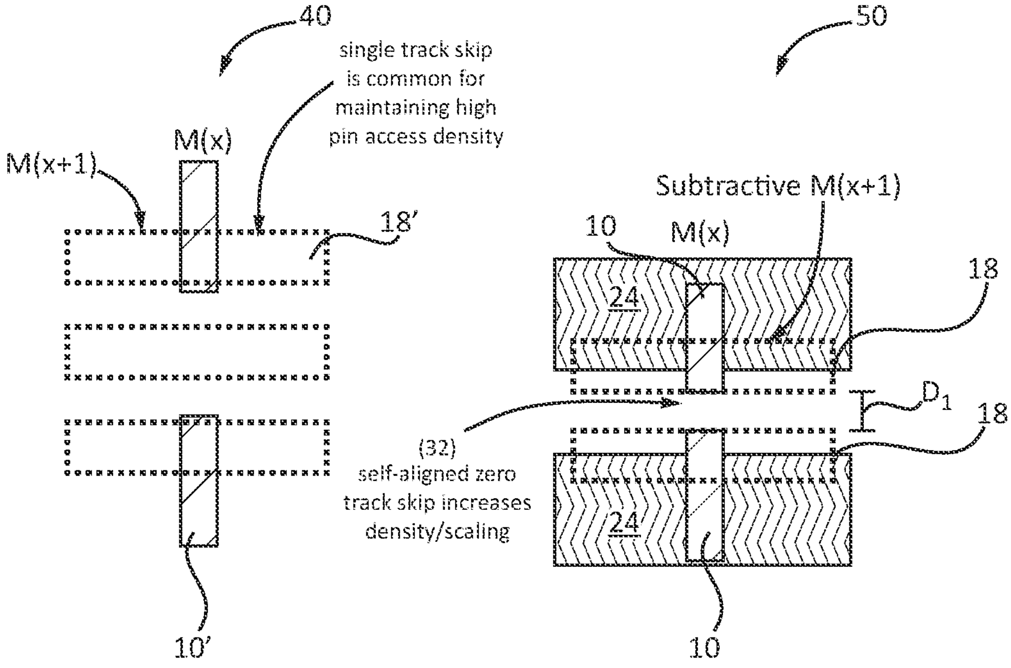
FIG. 5 is a top view comparing, on adjacent structures, a conventional single track skip to the novel self-aligned zero track skip, in accordance with an embodiment of the present invention.

FIG. 5 is a top view comparing, on adjacent structures, a conventional single track skip to the novel self-aligned zero track skip, in accordance with an embodiment of the present invention.

In various example embodiments, in structure 40, a conventional single track skip is illustrated with the M1 layer 10' and the M2 layer 18'. The M1 layer 10' can be designated as M(x) and the M2 layer 18' can be designated as M(x+1). The M1 layer 10' is orthogonal to the M2 layer 18'. A large distance is maintained between the distalmost ends of the M1 layers 10'. The single track skip is common for maintaining high pin access density.

In various example embodiments, in structure 50, the exemplary self-aligned zero track skip 32 is illustrated with the M1 layers 10 separated by a distance or spacing $D_1$ indicating separation between the distalmost end of the first line segment 11A and the distalmost end of the second line segment 11B (tip-to-tip spacing). In the structure 50, the M1 layers 10 are much closer together than the M1 layers 10' in the conventional structure 40.

Figure 6:
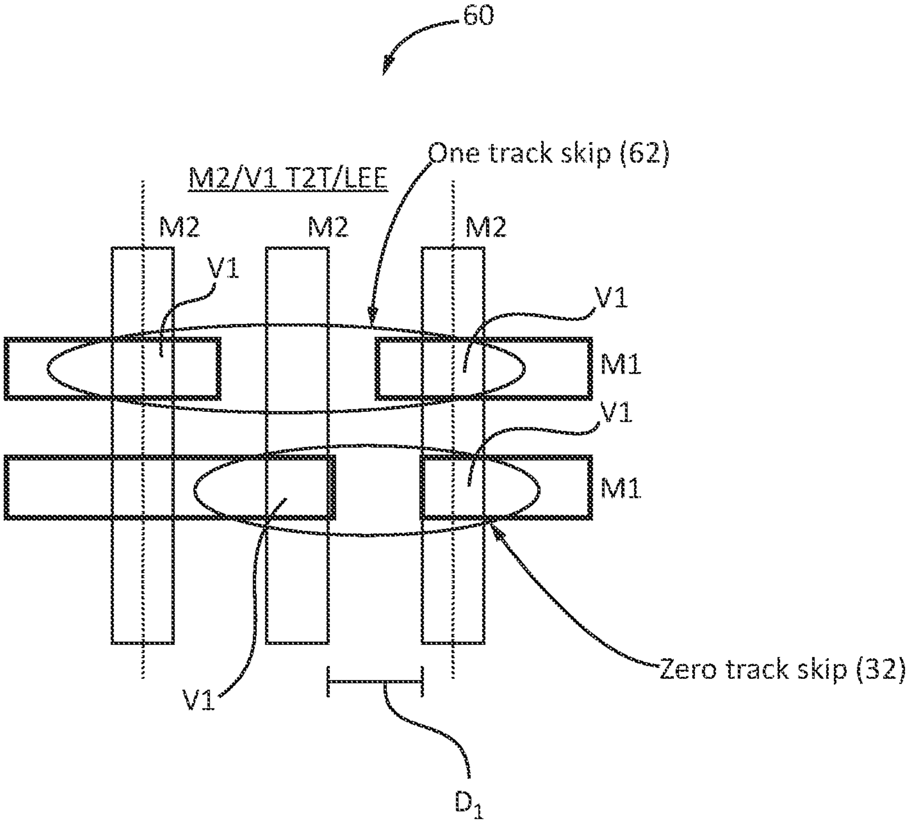
FIG. 6 is a top view comparing, on a same structure, a conventional single track skip to the novel self-aligned zero track skip, in accordance with an embodiment of the present invention.

FIG. 6 is a top view comparing, on a same structure, a conventional single track skip to the novel self-aligned zero track skip, in accordance with an embodiment of the present invention.

In various example embodiments, structure 60 illustrates the difference between a one track skip 62 and a zero track skip 32. The tip-to-tip distance between the M1 layers in the one track skip 62 is depicted in the large oval (upper M1 line) and the distance between the M1 layers in the zero track skip 32 is depicted in the small oval (lower M1 line). The zero track skip 32 on the M1/V1/M2 offers an area improvement of greater than 10%. The structure 60 thus illustrates the routed area improvement from the zero track skip 32 for tip-to-tip metal connections.

Figure 7:
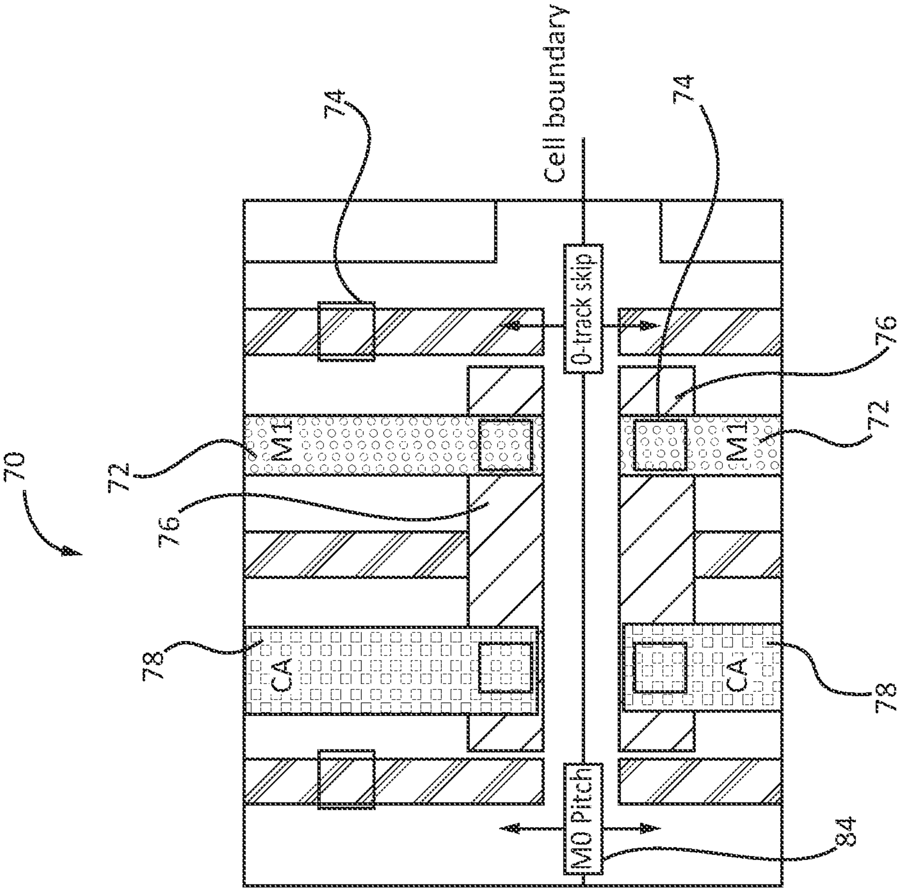
FIG. 7 is a top view illustrating cell height scaling, in accordance with an embodiment of the present invention.

FIG. 7 is a top view illustrating cell height scaling, in accordance with an embodiment of the present invention.

In various example embodiments, structure 70 depicts a top view of cell height scaling. The M1 layers 72 are shown orthogonal to the M2 layers 76. Contact to Active (CA) layer 78 is also shown parallel to the M1 layers 72. Vias 74 are also shown connecting the M1 layers 72 to the M2 layers 76. The M0 pitch is designated as 84. To enable the zero track skip 32 on connection to the M0 pitch 84, one via 74 extends up to the M1 layer 72 and another via 74 extends down to the CA layer 78. This enables cell height compression with an embodiment of BSPDN where there is no shared metal track at the cell height boundary but instead a pair of unshared metal tracks which straddle this boundary.

Figure 8:
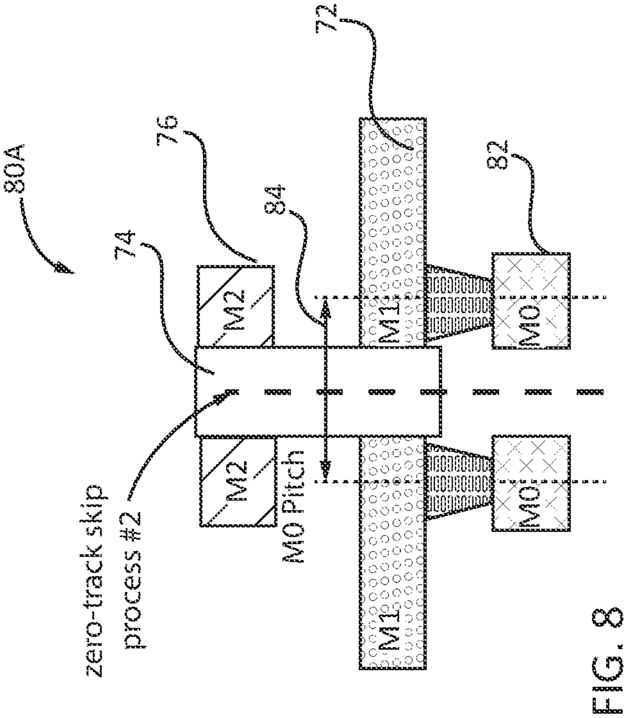
FIG. 8 is a cross-sectional view depicting the second zero track skip process, in accordance with an embodiment of the present invention.

FIG. 8 is a cross-sectional view depicting the second zero track skip process, in accordance with an embodiment of the present invention.

In various example embodiments, structure 80A depicts the M0 layer 82, the M1 layer 72, and the M2 layer 76. The M2 layer 72 is formed by subtractive etch. In structure 80A, the M2 layer 76 is used as a mask to achieve the zero track skip on the M1 layer 72. The M2 layer 76 is used at the same pitch as the M0 layer 82.

Figure 9:
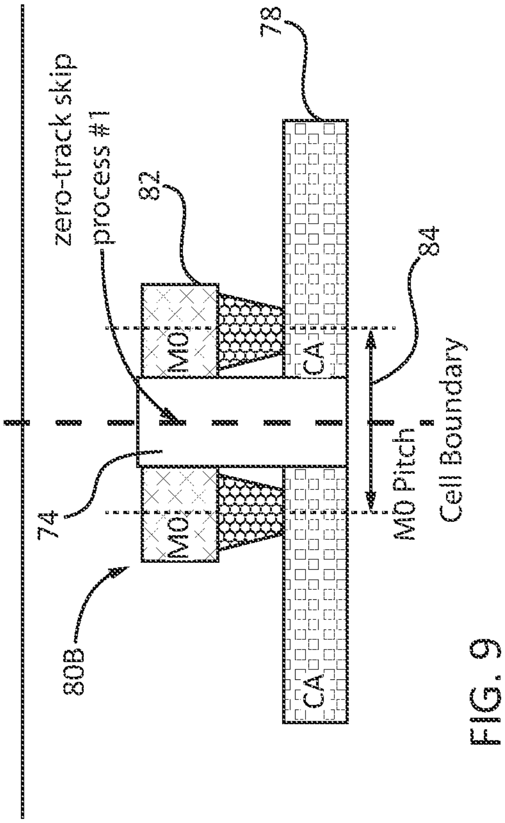
FIG. 9 is a cross-sectional view depicting the first zero track skip process, in accordance with an embodiment of the present invention.

FIG. 9 is a cross-sectional view depicting the first zero track skip process, in accordance with an embodiment of the present invention.

In various example embodiments, structure 80B depicts the CA layer 78 and the M0 layer 82. The M0 layer 82 is formed by subtractive etch. In structure 80B, the M0 layer 82 is used to achieve zero track skip on the CA layer 78.

Figure 10:
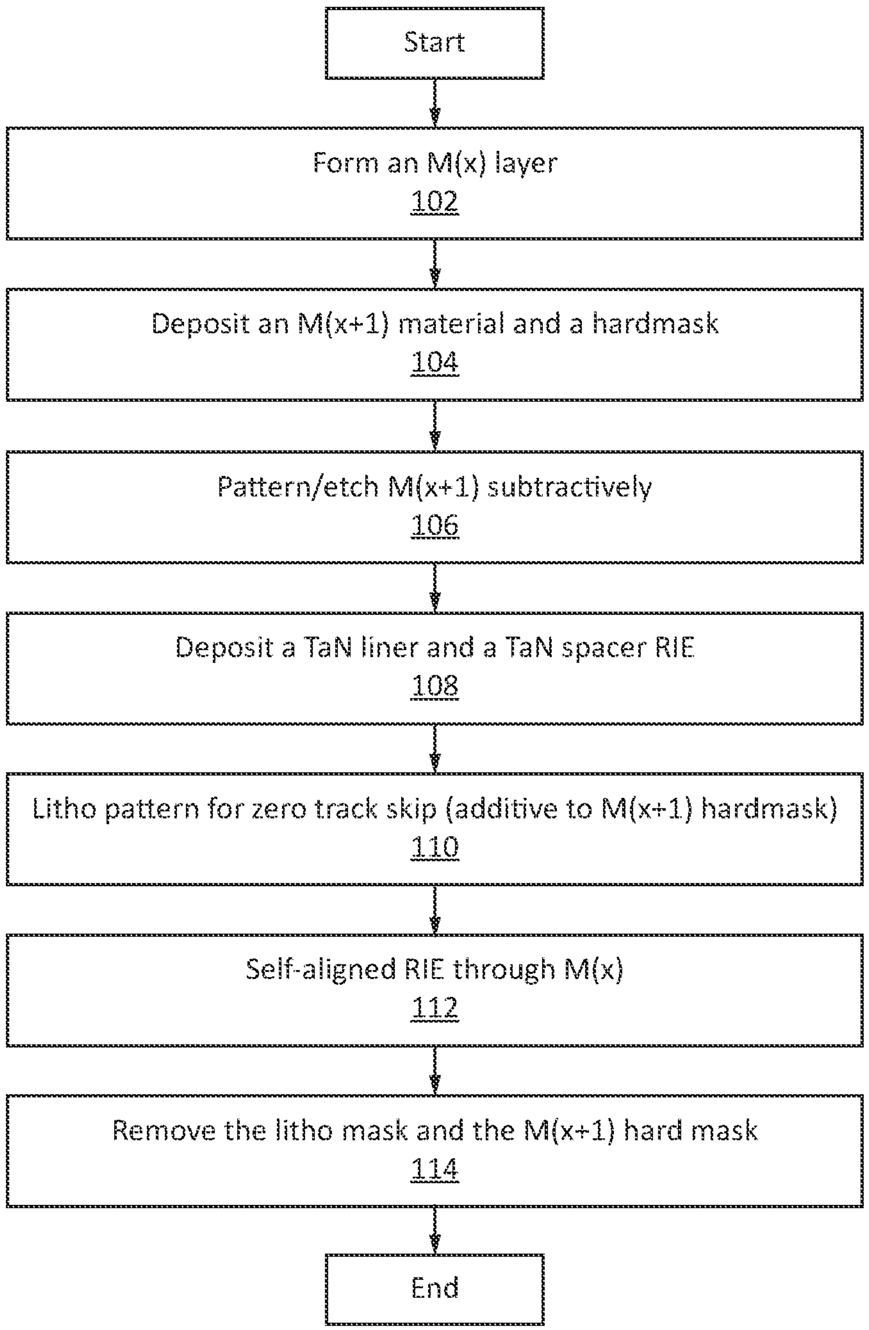
FIG. 10 is a block/flow diagram of a method for constructing a self-aligned zero track skip, in accordance with an embodiment of the present invention.

FIG. 10 is a block/flow diagram of a method for constructing a self-aligned zero track skip, in accordance with an embodiment of the present invention.

At block 102, form an M(x) layer.

At block 104, deposit an M(x+1) material and a hardmask.

At block 106, pattern/etch M(x+1) subtractively.

At block 108, deposit a TaN liner and a TaN spacer RIE.

At block 110, litho pattern for zero track skip (additive to M(x+1) hardmask).

At block 112, self-align RIE through M(x).

At block 114, remove the litho mask and the M(x+1) hardmask.

In semiconductor design technology, many metal layers are employed to implement interconnections throughout an integrated circuit. For some integrated circuits, one or more polysilicon (poly) layers, or even active areas, are also used to implement interconnections. Vias are employed to connect from one such metal or polysilicon layer to another metal or polysilicon layer. For example, a via can be used to connect a feature (e.g., a design geometry) on each of two metal layers. The lower one of the two layers is referred to as the landing metal layer and the upper one of the two layers is referred to as the covering layer. A via between a landing metal layer $mt_x$ and the covering metal layer $mt_{x+1}$ is usually referred to as a $v_x$ via (e.g., using the same subscript designation as the landing metal layer). Embodiments in accordance with the present invention provide methods and devices for incorporating skips in an integrated circuit design including a self-aligned zero track skip.

In conclusion, the exemplary embodiments of the present invention provide methods and devices for constructing a self-aligned zero track skip. In conventional semiconductor physical layouts, a single track skip is common for maintaining a high pin access density. However, a single track skip limits cell height compression. The exemplary self-aligned zero track skip can reduce cell height by 1 track or approximately 20%. The exemplary self-aligned zero track skip permits signal track enablement with backside power distribution networks (BSPDNs).

The exemplary semiconductor structure includes at least one pair of line segments of a metal layer (e.g., M1 layer) with a tip-to-tip spacing included within a single pitch of the overlying metal layer (e.g., M2 layer). The exemplary semiconductor structure further includes a first and second metal layer where the first metal layer exhibits a self-aligned cut, being within (or contained within) a single metal pitch of the second metal layer, by using the second metal layer as a hardmask. In other words, a subtractive M(x+1) layer is used itself as an etch mask to form the self-aligned zero track skip at a tip-to-tip spacing on the metal layer below, e.g., M1 layer. An advantage of the exemplary structure is that the spacing between the M(x+1) lines defines the Mx line end spacing by a self-aligned RIE. Another advantage of the exemplary structure is that the structure does not present an aspect ratio limitation for the Mx layer.

Regarding FIGS. 1-9, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Non-limiting examples of suitable conductive materials include doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further comprise dopants that are incorporated during or after deposition. The conductive material can be deposited by a suitable deposition process, for example, CVD, PECVD, PVD, plating, thermal or e-beam evaporation, and sputtering.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which usually include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of methods and structures for constructing a self-aligned zero track skip (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor structure comprising:

a first level of interconnect wiring separated into a first interconnect wiring segment and a second interconnect wiring segment, the first interconnect wiring segment defining a first line segment and the second interconnect wiring segment defining a second line segment;

a second level of interconnect wiring positioned orthogonally to the first level of interconnect wiring; and a tapered via connecting the first level of interconnect wiring to the second level of interconnect wiring, a tapered sidewall of the tapered via being coplanar with a sidewall of the first line segment;

wherein a distalmost end of the first line segment and a distalmost end of the second line segment are separated by a spacing less than or equal to a width of the second level of interconnect wiring, the spacing defining a zero track skip; and wherein a width of the tapered via is larger than the width of the second level of interconnect wiring.

2. The semiconductor structure of claim 1, wherein the second level of interconnect wiring is subtractively patterned to define a positive tapered angle.

3. The semiconductor structure of claim 1, wherein outer surfaces of the first and second line segments are self-aligned to corresponding outer surfaces of the second level of interconnect wiring.

4. The semiconductor structure of claim 1, wherein a capping layer is disposed over and in direct contact with the second level of interconnect wiring.

5. The semiconductor structure of claim 4, wherein the capping layer defines a first positive tapered angle.

6. The semiconductor structure of claim 5, wherein an etch-resistant liner is disposed on sidewalls of the second level of interconnect wiring and sidewalls of the capping layer.

7. The semiconductor structure of claim 6, wherein the etch-resistant liner defines a second positive tapered angle.

8. The semiconductor structure of claim 1, wherein the separation of the first level of interconnect wiring into the first interconnect wiring segment and the second interconnect wiring segment occurs directly between the second level of interconnect wiring.

9. The semiconductor structure of claim 1, wherein the first level of interconnect wiring exhibits a self-aligned cut, and wherein a width of the self-aligned cut is less than or equal to the width of the second level of interconnect wiring.

10. The semiconductor structure of claim 1, wherein outer surfaces of the first and second line segments maintain a uniform offset from corresponding outer surfaces of the second level of interconnect wiring.

11. The semiconductor structure of claim 1, wherein outer surfaces of the first and second line segments maintain a uniform offset from corresponding outer surfaces of the second level of interconnect wiring.

12. A semiconductor structure comprising:

a first level of interconnect wiring exhibiting a self-aligned cut and split into a first line segment and a second line segment;

a second level of interconnect wiring positioned orthogonally to the first level of interconnect wiring; and a tapered via connecting the first level of interconnect wiring to the second level of interconnect wiring, a tapered sidewall of the tapered via being coplanar with a sidewall of the first line segment;

wherein the first line segment and the second line segment define a pair of line segments having a tip-to-tip spacing less than or equal to a width of the second level of interconnect wiring; and wherein a width of the tapered via is larger than the width of the second level of interconnect wiring.

13. The semiconductor structure of claim 12, wherein the tip-to-tip spacing defines a zero track skip.

14. The semiconductor structure of claim 12, wherein a width of the self-aligned cut is less than or equal to the width of the second level of interconnect wiring.

15. The semiconductor structure of claim 12, wherein outer surfaces of the pair of line segments are self-aligned to corresponding outer surfaces of the second level of interconnect wiring.

16. The semiconductor structure of claim 12, wherein a capping layer is disposed over and in direct contact with the second level of interconnect wiring.

17. The semiconductor structure of claim 16, wherein the capping layer defines a first positive tapered angle.

18. The semiconductor structure of claim 17, wherein an etch-resistant liner is disposed on sidewalls of the second level of interconnect wiring and sidewalls of the capping layer.

19. The semiconductor structure of claim 18, wherein the etch-resistant liner defines a second positive tapered angle.

20. The semiconductor structure of claim 12, wherein a distalmost end of the first line segment and a distalmost end of the second line segment are disposed beneath corresponding inside edges of the second level of interconnect wiring.

* * * * *